United States Patent
Zang et al.

(10) Patent No.: US 9,805,982 B1
(45) Date of Patent: Oct. 31, 2017

(54) APPARATUS AND METHOD OF ADJUSTING WORK-FUNCTION METAL THICKNESS TO PROVIDE VARIABLE THRESHOLD VOLTAGES IN FINFETS

(71) Applicant: GLOBALFOUNDRIES Inc., Grand Cayman (KY)

(72) Inventors: Hui Zang, Guilderland, NY (US); Min-hwa Chi, San Jose, CA (US); Jinping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/156,767

(22) Filed: May 17, 2016

(51) Int. Cl.
H01L 21/8234 (2006.01)
H01L 29/66 (2006.01)
H01L 27/088 (2006.01)
H01L 29/49 (2006.01)

(52) U.S. Cl.
CPC ........... *H01L 21/823456* (2013.01); *H01L 21/823431* (2013.01); *H01L 21/823468* (2013.01); *H01L 27/0886* (2013.01); *H01L 29/4916* (2013.01); *H01L 29/6653* (2013.01); *H01L 29/66545* (2013.01)

(58) Field of Classification Search
CPC ......... H01L 29/66545; H01L 29/66795; H01L 29/785; H01L 21/823431; H01L 21/823821; H01L 27/0886; H01L 27/0924; H01L 21/823456; H01L 21/823468; H01L 29/4916; H01L 29/6653
USPC ........ 257/401, 369, 288; 438/283, 586, 587, 438/595, 183
See application file for complete search history.

(56) References Cited

U.S. PATENT DOCUMENTS

| | | | |
|---|---|---|---|
| 8,765,546 B1 * | 7/2014 | Hung | H01L 21/82343 257/190 |
| 2008/0277739 A1 * | 11/2008 | Curatola | H01L 21/82341 257/393 |

(Continued)

OTHER PUBLICATIONS

M. Kadoshima et al., "Effective-Work-Function Control by Varying the TiN Thickness in Poly-Si/TiN Gate Electrodes for Scaled High-k CMOSFETs", IEEE EDL, vol. 30, No. 5, pp. 466-468, Mar. 31, 2009.

(Continued)

*Primary Examiner* — Jonathan Han
(74) *Attorney, Agent, or Firm* — Heslin Rothenberg Farley & Mesiti P.C.

(57) ABSTRACT

A method of adjusting work-function metal thickness includes providing a structure having a substrate, the substrate including a longitudinally extending array of fins disposed thereon. Spacers are then formed on sidewalls of fins of the array. Pillars are formed between and adjacent the spacers. A gate having dummy gate material is formed over the structure, the gate extending laterally across the spacers and fins of the array. The dummy gate material and spacers are removed from the gate to form work-function (WF) metal trenches defined by the pillars and fins within the gate. The WF metal trenches have a first trench width. A thickness of the pillars is adjusted to provide a second trench width, different from the first trench width, for the WF metal trenches. A WF metal structure is disposed within the WF metal trenches.

17 Claims, 14 Drawing Sheets

(56) References Cited

U.S. PATENT DOCUMENTS

2012/0196425 A1* 8/2012 Scheiper ........... H01L 29/66545
  438/400
2013/0181299 A1* 7/2013 Baldauf ............ H01L 29/66545
  257/401

OTHER PUBLICATIONS

N. Inoue et al., "UV Cure Impact on Robust Low-k with Sub-nm Pores and High Carbon Content for High Performance Cu/Low-k BEOL Modules", IEEE, IITC, 2013.
U.S. Appl. No. 15/156,822, filed May 17, 2016, titled Method of Adjusting Spacer Thickness to Provide Variable Threshold Voltages in FinFETs.

* cited by examiner

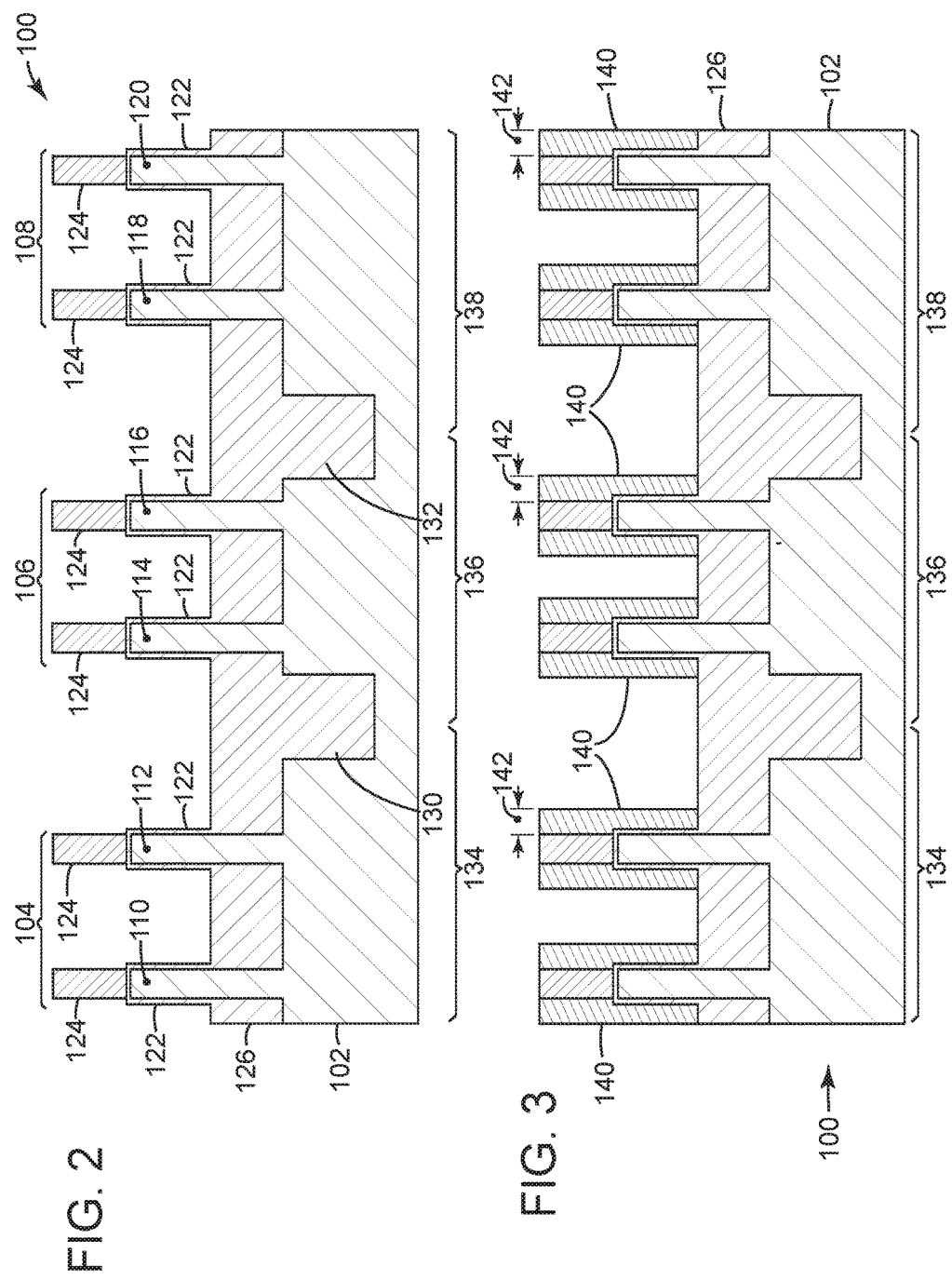

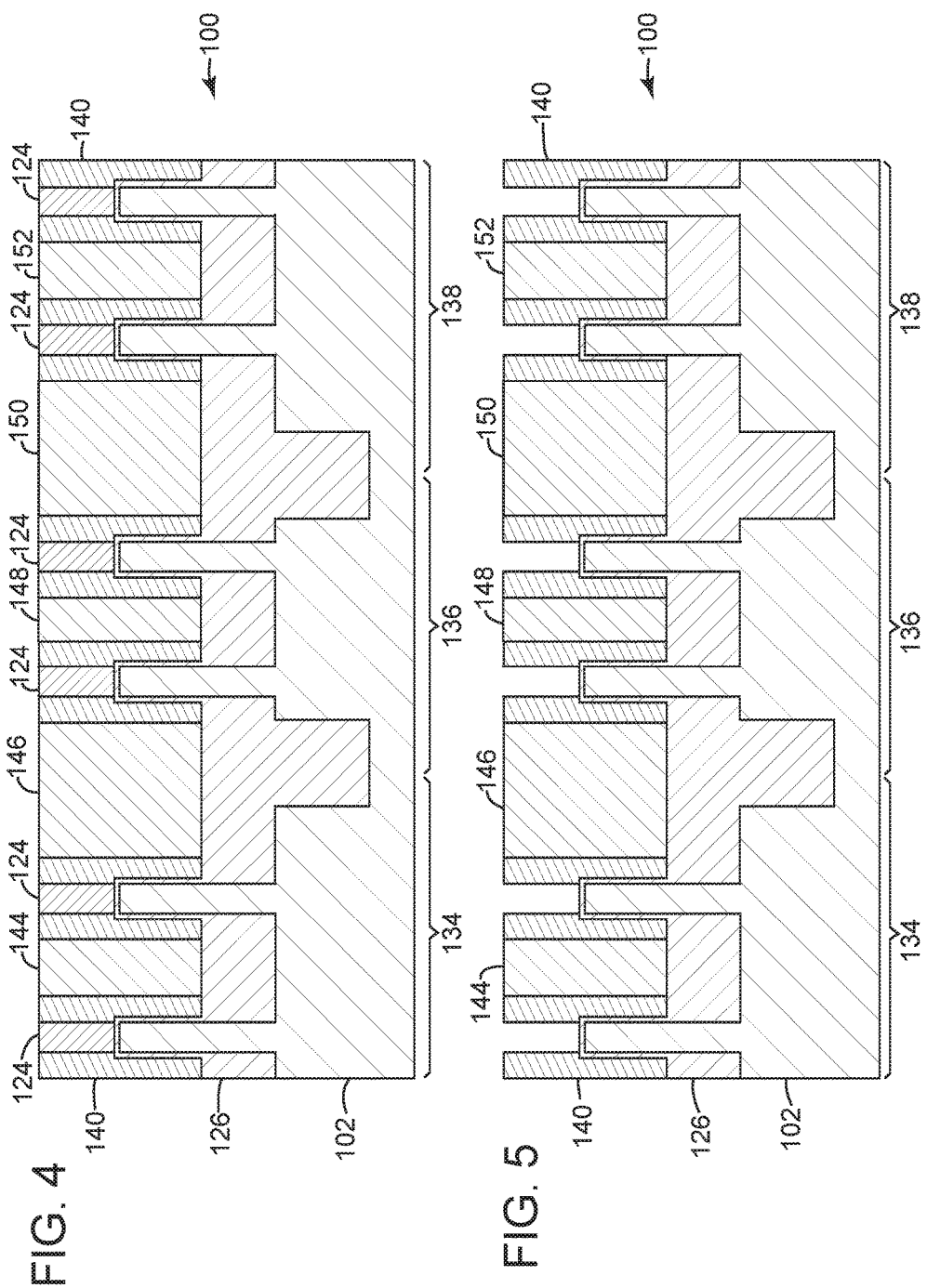

APPARATUS AND METHOD OF ADJUSTING WORK-FUNCTION METAL THICKNESS TO PROVIDE VARIABLE THRESHOLD VOLTAGES IN FINFETS

TECHNICAL FIELD

The present invention relates to semiconductor devices and methods of fabricating the same. More specifically, the invention relates to an apparatus and method of adjusting work-function metal thicknesses to provide variable threshold voltages for FinFETs.

BACKGROUND

With constant down-scaling and increasingly demanding requirements to the speed, and functionality of advanced Fin Field Effect Transistor (FinFET) technology, there is a growing need for integrated circuits having FinFETs with multiple threshold voltages (Vt) and methods of making the same. This is particularly the case for smaller scale integrated circuits, such as the 14 nanometer (nm) class and beyond.

A typical prior art method of implementing a multiple Vt design for an integrated circuit has been through the implementation of dopants in the channel or fins of the FinFETs. However, such implantation methods lead to high defect density (due to added implanting, etching and the like) and degraded yield.

Another prior art method of making a multiple Vt integrated circuit has been by adjusting the work-function (WF) metal thickness in gates of FinFETs. Typically however, such methods include multiple depositions and removals of WF metal over the high-k dielectric in a gate stack within a FinFET semiconductor region. For example, a first layer of WF metal having a first thickness may be disposed over the high-k dielectrics in the gate stacks of an entire semiconductor region. A first portion of the region may then be masked or blocked off. The first layer of WF metal in a second unmasked portion of the region is then removed by such means as wet etching, dry etching or a suitable combination of both, leaving the dielectric in the second portion exposed again. The mask is then removed from the first portion. A second layer of WF metal having a second thickness is then disposed over the entire region. The result is that the first portion of the semiconductor region has a total WF metal thickness of the combined thicknesses of the first and second WF metal layers, while the second portion of the semiconductor region has a total WF metal thickness of just the second WF metal thickness. Each WF metal thickness will correspond to a different Vt. This process can continue to provide multiple WF metal thicknesses and multiple threshold voltages for multiple portions of a semiconductor region.

Problematically however, such prior art method of adjusting the WF metal requires multiple depositions and removals of the WF metal, which can greatly increase the likelihood of damaging the thin high-k dielectric and WF layers previously formed. Also it increases the possibility of defects in the gate structure due to repeated exposure of the dielectric to etching and other processes.

Accordingly, there is a need for an apparatus and method of implementing a multi-Vt design in an integrated circuit that does not increase the possibility of damaging the channel, fins or gate areas. More specifically, there is a need for an apparatus and method of adjusting the Vt through variations in thicknesses of WF metal in a FinFET integrated circuit that does not involve multiple depositions and removals of the WF metal.

BRIEF DESCRIPTION

The present invention offers advantages and alternatives over the prior art by providing an apparatus and method of adjusting work-function metal thickness to provide variable threshold voltages for FinFETs. The methods involve adjustments of work-function thicknesses in ways that do not involve multiple depositions and removals of the work-function metal.

A method in accordance with one or more aspects of the present invention includes providing a structure having a substrate, the substrate including a longitudinally extending array of fins disposed thereon. Spacers are then formed on sidewalls of fins of the array. Pillars are formed between and adjacent the spacers. A gate having dummy gate material is formed over the structure, the gate extending laterally across the spacers and fins of the array. The dummy gate material and spacers are removed from the gate to form work-function (WF) metal trenches defined by the pillars and fins within the gate. The WF metal trenches have a first trench width. A thickness of the pillars is adjusted to provide a second trench width, different from the first trench width, for the WF metal trenches. A WF metal structure is disposed within the WF metal trenches.

In another aspect of the invention a method includes providing a structure having a substrate, the substrate including longitudinally extending first and second arrays of fins formed thereon. Spacers are then formed on sidewalls of fins of the first and second arrays. First pillars are formed between and adjacent the spacers of the first array. Second pillars are formed between and adjacent the spacers of the second array. A gate is formed having dummy gate material over the structure, the gate extending laterally across the spacers and fins of the first and second arrays. The dummy gate material and spacers are removed from the gate to form first WF metal trenches defined by the first pillars and fins of the first array within the gate. The dummy gate material and spacers are also removed from the gate to form second WF metal trenches defined by the second pillars and fins of the second array within the gate.

In another aspect of the invention a semiconductor structure includes a substrate having a longitudinally extending first array of fins formed thereon. A gate structure extends laterally across the fins of the first array. The gate structure includes:

a. a gate dielectric material disposed over the fins of the first array, b. UV cured nitride first pillars disposed between the fins of the first array, the fins of the first array and first pillars defining a plurality of first WF metal trenches having a first trench width, c. first WF metal structures disposed within the first WF metal trenches and over the fins of the first array, and d. an electrode metal layer disposed over the first WF metal structures.

DRAWINGS

The invention will be more fully understood from the following detailed description taken in conjunction with the accompanying drawings, in which:

FIG. 1 is a simplified perspective view of an exemplary embodiment of a variable Vt semiconductor structure 100 for an integrated circuit device at an intermediate stage of manufacturing in accordance with the present invention;

FIG. 2 is a cross-sectional view of FIG. 1 taken along the line 2-2 with an oxide layer grown on sidewalls of fins of the structure in accordance with the present invention;

FIG. 3 is a cross-sectional view of FIG. 2 with spacers formed on sidewalls of the fins in accordance with the present invention;

FIG. 4 is a cross-sectional view of FIG. 3 with pillars disposed between and adjacent the spacers in accordance with the present invention;

FIG. 5 is a cross-sectional view of FIG. 4 with a hardmask layer removed from the tops of the fins in accordance with the present invention;

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-15 illustrate various exemplary embodiments of an apparatus and method of forming an integrated circuit structure 100 having variable threshold voltages (Vts). The Vts are provided by adjusting work-function (WF) metal thickness within the gate stacks of FinFETs in accordance with the present invention.

Figure 1:
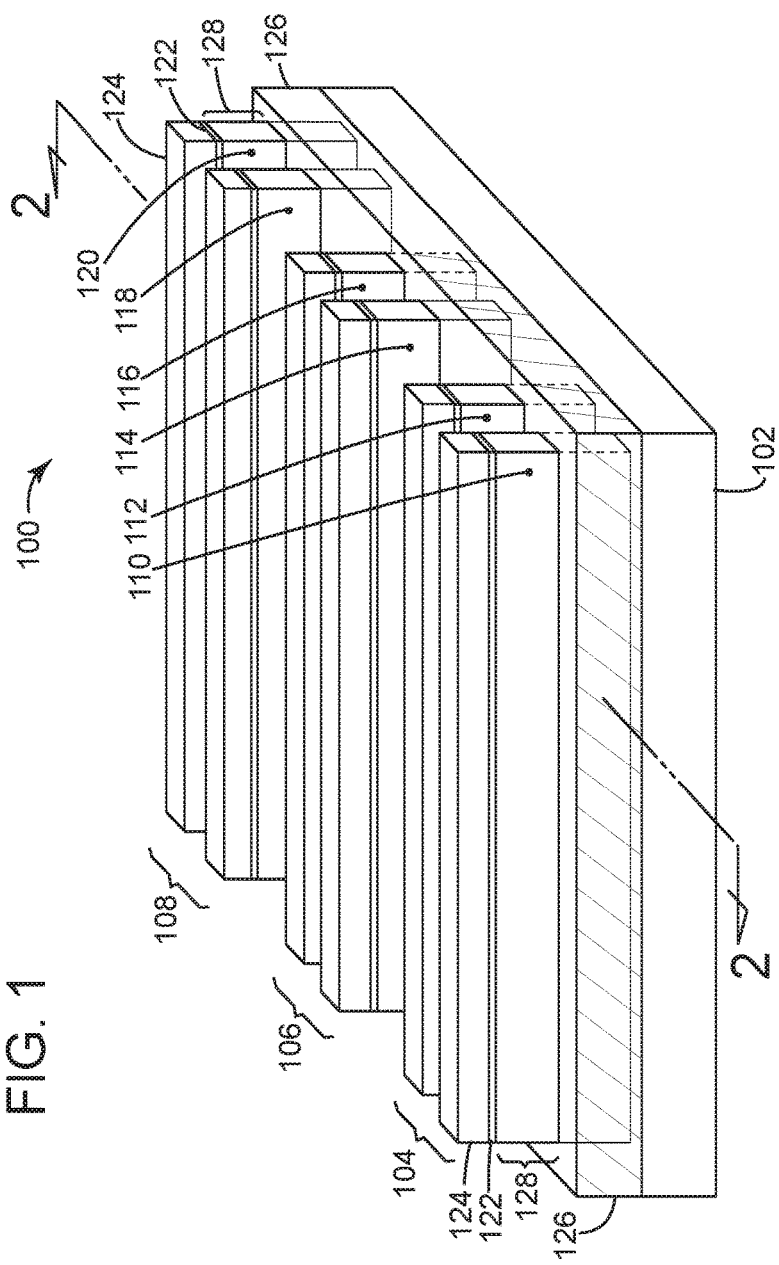

Referring to FIG. 1, a simplified perspective view of an exemplary embodiment of a variable Vt semiconductor structure 100 for an integrated circuit device in accordance with the present invention is presented at an intermediate stage of manufacturing. Structure 100 includes a substrate 102 having first, second and third arrays of fins 104, 106 and 108 (i.e., 104-108) respectively. The first fin array 104 includes fins 110 and 112, the second fin array 106 includes fins 114 and 116, while the third fin array 108 includes fins 118 and 120. Fins 110, 112, 114, 116, 118 and 120 (i.e., 110-120), which were formed by well-known methods, extend laterally across the substrate 102. The fins 110-120 may be n-type fins, p-type fins or a combination of both. Though six fins are illustrated for this embodiment, any number of fins grouped in any number of arrays may be included in the substrate 102.

Disposed over each top surface of the fins 110-120 is a protective thin (typically approximately 1-2 nm) oxide layer 122. Oxide layer 122 may be formed by thermally oxidizing the exposed surface of substrate 102 prior to fin formation, or may be deposited onto the substrate 102 using, for example, chemical vapor deposition (CVD) or atomic layer deposition (ALD).

A hardmask layer 124 is disposed over the oxide layer 122 of each fin 110-120. Hardmask layer 124 was originally used to protect and define the fins 110-120 during the formation process. The hardmask 124 may be composed of a titanium nitride (TiN), silicon nitride (SiN) or similar.

A flowable oxide (FOX) layer 126 was initially disposed over the fins 110-120 and planarized using such methods as chemical-mechanical polishing (CMP) to expose the hardmask layer 124 disposed on the tops of the fins. The FOX layer 126 was then recessed using standard lithographic and etching processes that are well-known. The exposed portion of the fins 110-120, which extend above the recessed FOX layer 120, now define an active height 128 of the fins.

Referring to FIG. 2, a cross-sectional side view of FIG. 1 taken along lines 2-2 is illustrated. In FIG. 2 the oxide layer 122 is next grown on the sidewalls of fins 110-120 to conformally coat the fins. From this view, it can be seen that shallow trench isolation (STI) trenches 130 and 132 have been etched into substrate 102 to divide structure 100 into first, second and third distinct electrically isolated regions 134, 136 and 138 respectively. The first region 134 includes first fin array 104, the second region 136 includes second fin array 106, and the third region includes third fin array 108. Though three regions 134-138 are illustrated for this embodiment, any number of regions may be included in the substrate 102.

As will be explained in greater detail herein, each array 104-108 will be designed for FinFET devices having a unique threshold voltage (Vt) associate with that array and different from the other arrays. The Vts associated with each array will vary depending upon the various thicknesses of the work-function metal structures in the gate stacks of the FinFET devices.

Referring to FIG. 3, next spacers 140 having a uniform thickness 142 are formed on the sidewalls of the fins 110-120. Spacers 140 are formed by first disposing a conformal layer (not shown) of spacer material having a uniform thickness 142 over the fins 110-120 and then anisotropically etching the spacer layer to form the spacers 140. The uniform thickness 142 of spacers 140 can typically range from 3 to 10 nanometers (nm). The spacers 140 may be composed of an amorphous silicon (a-Si) or similar poly-silicon material.

Referring to FIG. 4, pillars 144, 146, 148, 150 and 152 (i.e., 144-152) are then disposed between and adjacent the sidewalls of the spacers 140. Pillars 144-152 are formed by first disposing a pillar layer (not shown) of pillar material over the entire structure 100, including the areas between the spacers 140. The pillar layer is then planarized down via such processes as chemical-mechanical polishing (CMP) or similar to expose, again, top surfaces of the hardmask layer 124 and to finalize formation of pillars 144-152. The pillars 144-152 may be formed of a nitride (such as a silicon nitride) or similar ultraviolet curable material that changes dimension when exposed to ultra violet energy (e.g., a UV curable nitride).

Referring to FIG. 5, the hardmask layer 124 is removed from the tops of the fins 110-120. The hardmask layer 124 can be removed by such means as wet etching, reactive ion etching (RIE) or similar.

Figure 6:
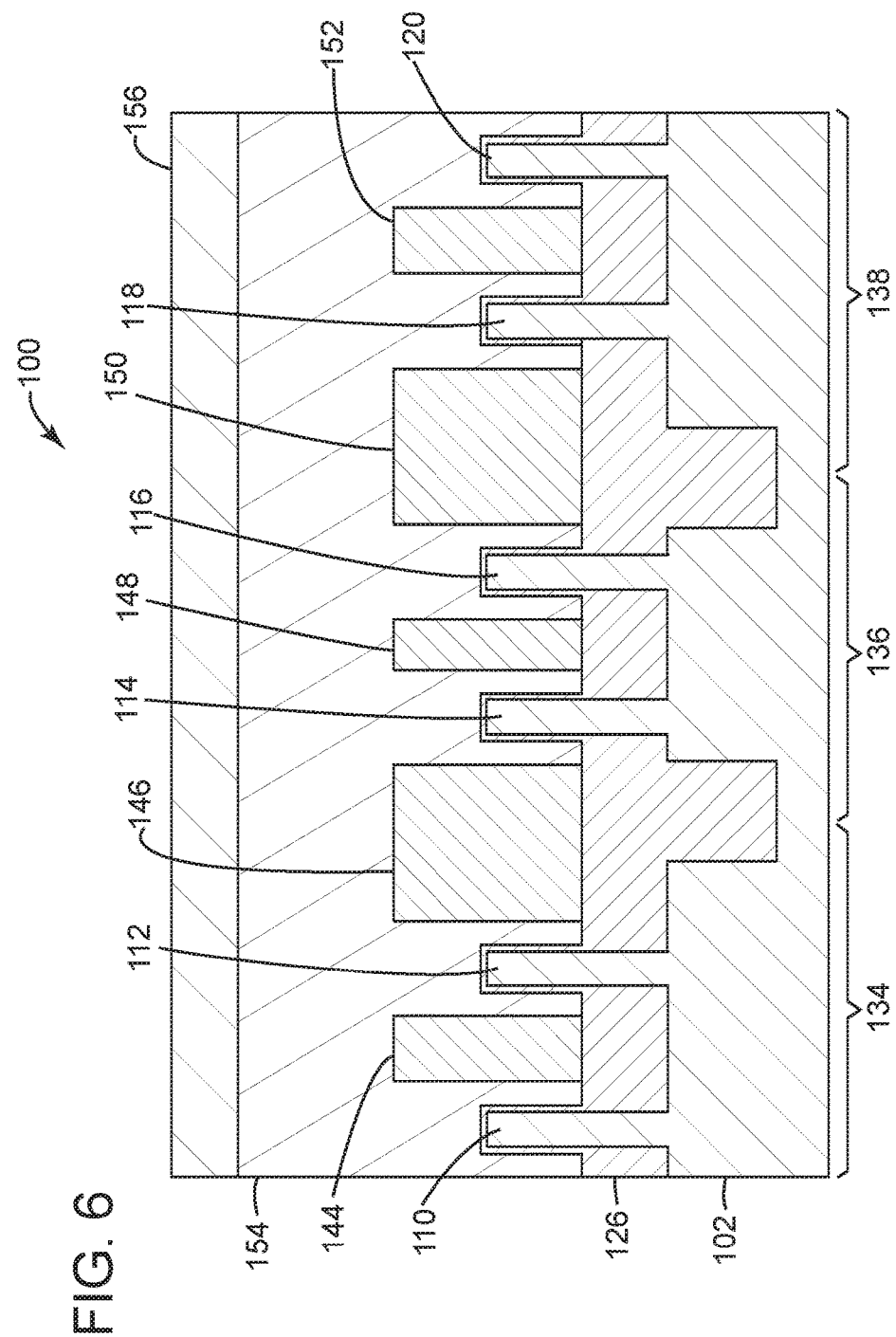
FIG. 6 is a cross-sectional view of FIG. 5 with a dummy gate layer and hardmask layer disposed over the fins and pillars in accordance with the present invention.

Referring to FIG. 6, Next, a layer of poly-silicon dummy gate material 154 is disposed over the structure 100 and a hardmask layer 156 is disposed over the dummy gate material. The poly-silicon dummy gate material 154 is deposited over structure 100 using well-known processes such as chemical vapor deposition (CVD), physical vapor deposition (PVD) or the like. Following the deposition, dummy gate material 154 can be planarized to facilitate subsequent gate formation steps, using for example chemical-mechanical polishing (CMP).

The hardmask layer 156 may also be disposed using CVD, PVD or the like. The hardmask layer is used in subsequent gate formation and may be disposed of silicon nitride (SiN), titanium nitride (TiN) or similar.

Note that the poly-silicon dummy gate material 154 is typically the same material as that of the amorphous silicon spacers 140, so the spacers and dummy gate material typically blend together as a single layer of dummy gate material 154. As such, the dummy gate material can be advantageously disposed over the structure 100 without first removing the spacers 140.

Alternatively, the spacers 140 can be removed prior to deposition of the dummy gate material 154. However, because the spacer thickness 142 of spacers 140 is typically within a range of 3-10 nm, it is sometimes difficult to fill the small trenches (herein referred to as WF metal trenches) between the pillars 144-152 and the fins 110-120, where the spacers 140 are currently disposed. This is especially the case when the aspect ratio of the trenches is greater than 5. As such the method of disposing the dummy gate material 154 over the structure 100 without removing the spacers 140 is preferred.

Figure 7A:
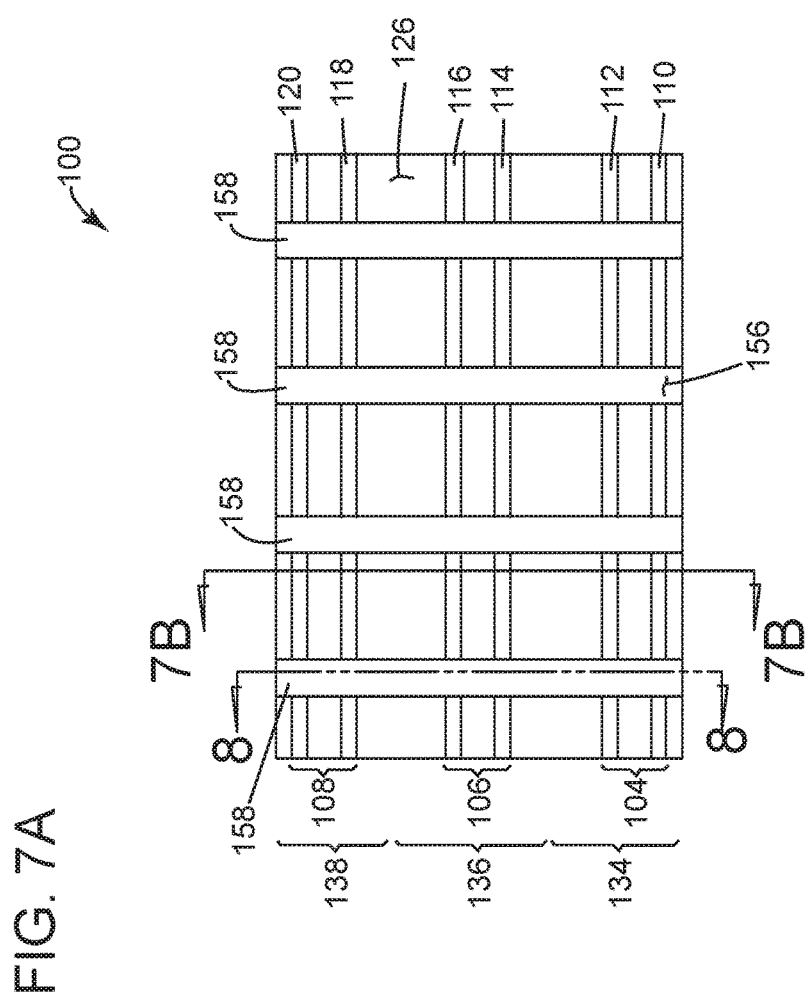
FIG. 7A is a top planar view of the structure of FIG. 6 with dummy gates formed laterally over the fins in accordance with the present invention.
Figure 7B:
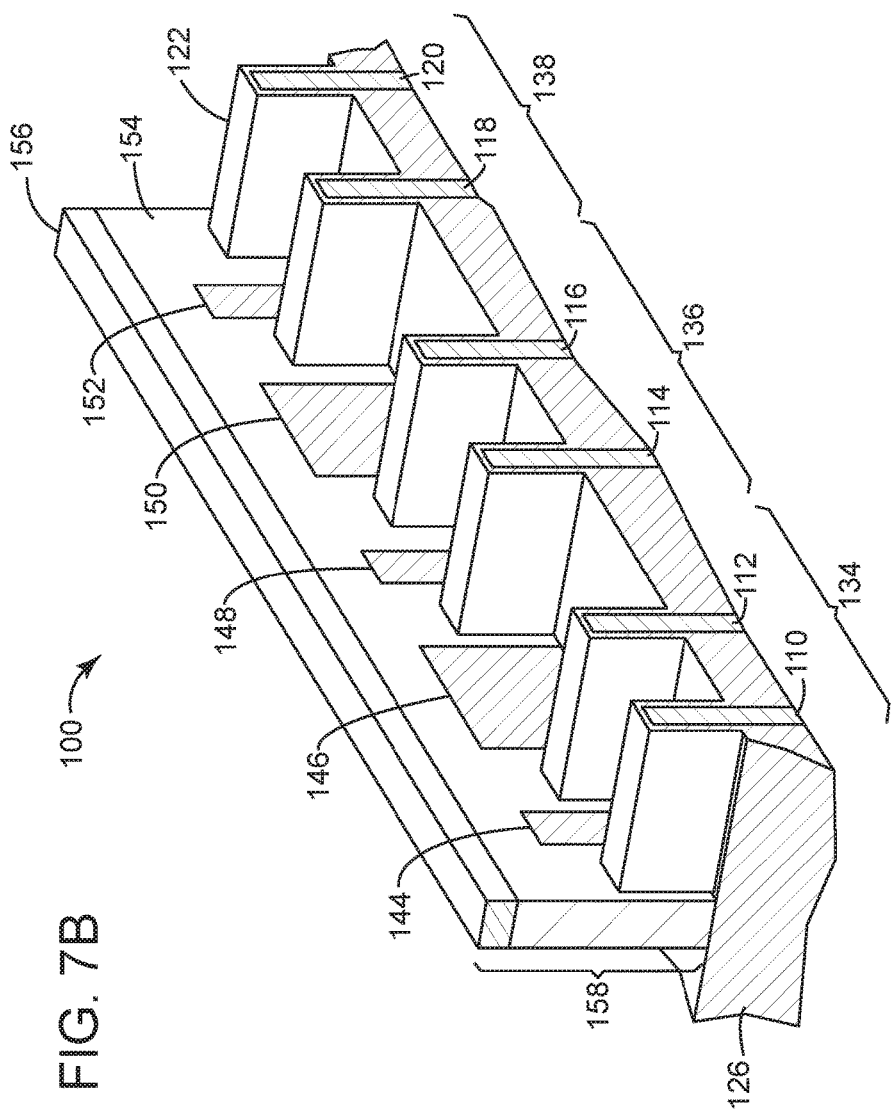
FIG. 7B is a perspective view of FIG. 7A taken along line 7B-7B in accordance with the present invention.

Referring to FIGS. 7A and 7B, an exemplary embodiment of a top planar view and perspective view of the structure 100 after formation of a plurality of dummy gates 158 is presented. Dummy gates 158 are created by etching the polysilicon dummy gate layer 154 of FIG. 6 using well-known processes such as standard lithographic processes and anisotropic dry etching such as reactive ion etching (RIE).

As can be best seen from perspective view FIG. 7B, the pillars 144-152 in the areas of structure 100 located between the gates 158 have also been anisotropically etched down, but not the fins 110-120. Later in the process flow, the fins 110-120 will also be anisotropically etched down in the areas between the gates 158 to prepare for epitaxial growth of source/drain regions (not shown).

Additionally at this stage of the process flow, the well-known gate spacers (not shown), which are used to abut and define the outer lateral boundaries of the gates 158, have not yet been formed on the sidewalls of the gates 158. Therefore, the ends of the pillars 144-152 within the gates 158 are clearly visible, as the pillars extend laterally across the gates and now terminate at the gate's outer lateral boundaries.

Figure 8:
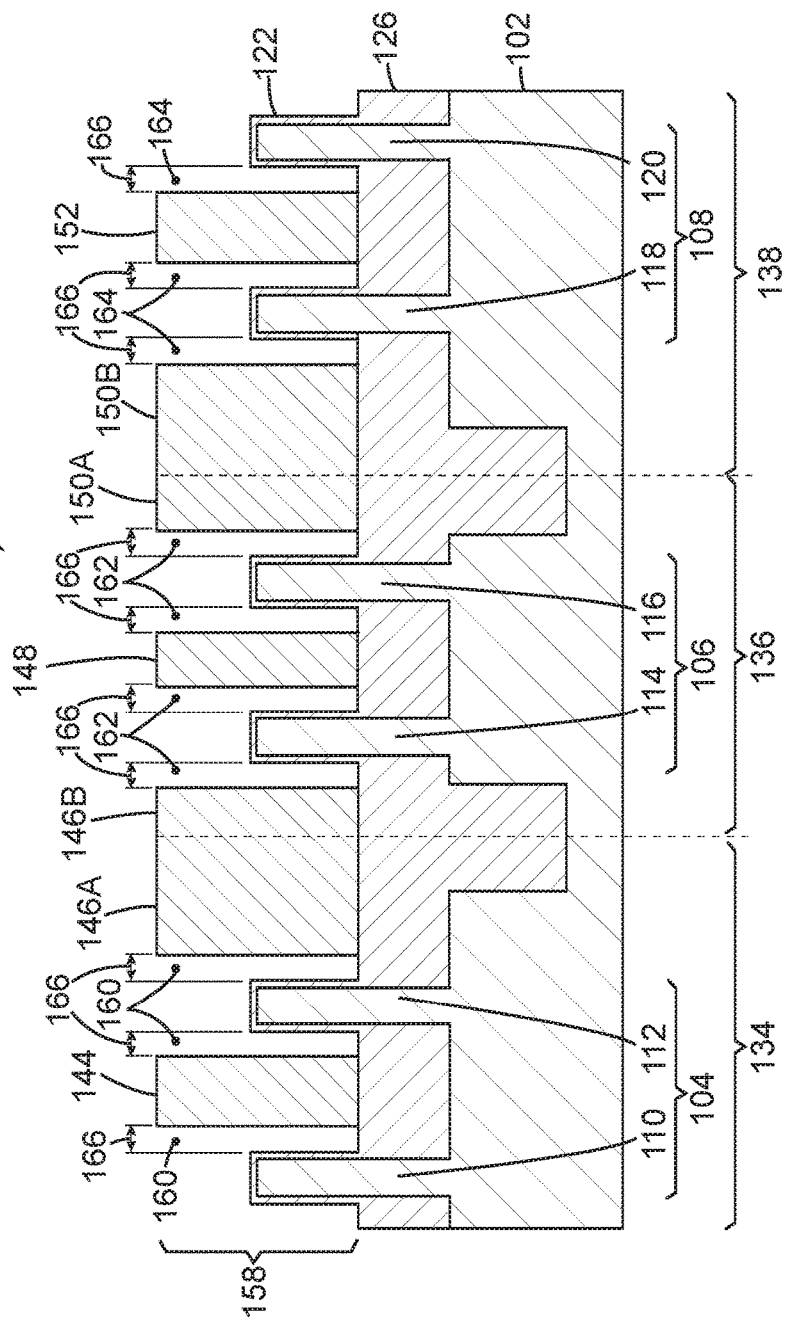
FIG. 8 is a cross-sectional view of FIG. 7A taken along line 8-8 with the dummy gate layer removed from the gates in accordance with the present invention.

Referring to FIG. 8, a cross-sectional side view of a gate 158 taken along the line 8-8 of FIG. 7A is presented. At this stage of the process flow, the gate spacers (not shown) have been formed on the sidewalls of the gates 158 to define the lateral boundaries of the gates. Additionally the poly-silicon dummy gate material 154 and the amorphous silicon spacers 140 have been removed from the gates 158 to form work-function (WF) metal trenches 160, 162 and 164, which are defined by the pillars 144-152 and fins 110-120 within the gate 158. The dummy gate material 154 and spacers 140 may be removed by a wet etching process, a selective RIE process or similar. The thin protective oxide layer 122 was used to protect the fins 110-120 during the dummy gate material 154 removal process and still remains over the fins 110-120.

It is important to note that the WF metal trenches 160, 162 and 164 and the UV curable nitride pillars 144-152 may be categorized into first, second and third groups of trenches and pillars. The first, second and third group of pillars and trenches are associated with the first, second and third fin arrays 104, 106 and 108 respectively. The first, second and third fin arrays 104, 106 and 108 are each disposed in their associated first, second and third electrically isolated regions 134, 136 and 138 of the structure 100. The regions 134, 136 and 138 being electrically isolated by STI trenches 130 and 132.

More specifically, pillar 144 and that portion 146A of pillar 146 which overlay the electrically isolated first region 134 are considered, for purposes herein, the first pillars. The first pillars 144, 146A and fins 110, 112 of first array 104 define the first WF metal trenches 160. Note that the thin oxide layer 122 does not define any of the trenches 160, 162, 164 because it is sacrificial and will later be removed before the trenches are filled with permanent gate stack structures.

Additionally, the portion 146B of pillar 146, pillar 148 and the portion 150A of pillar 150 which overlay the electrically isolated second region 136 are considered, for purposes herein, the second pillars. The second pillars 146B, 148, 150A and fins 114, 116 of second array 106 define the second WF metal trenches 162.

Finally, the portion 150B of pillar 150 and pillar 152 which overlay the electrically isolated third region 138 are considered, for purposes herein, the third pillars 164. The third pillars 150B, 152 and fins 118, 120 of the third array 108 define the third WF metal trenches 164.

It is also important to note that at this stage of the process flow all of the trenches 160, 162 and 164 have the same first trench width 166. This is due to the fact that the first trench width 166 was defined by the substantially uniform spacer thickness 142 of the now removed amorphous silicon spacers 140.

Figure 9:
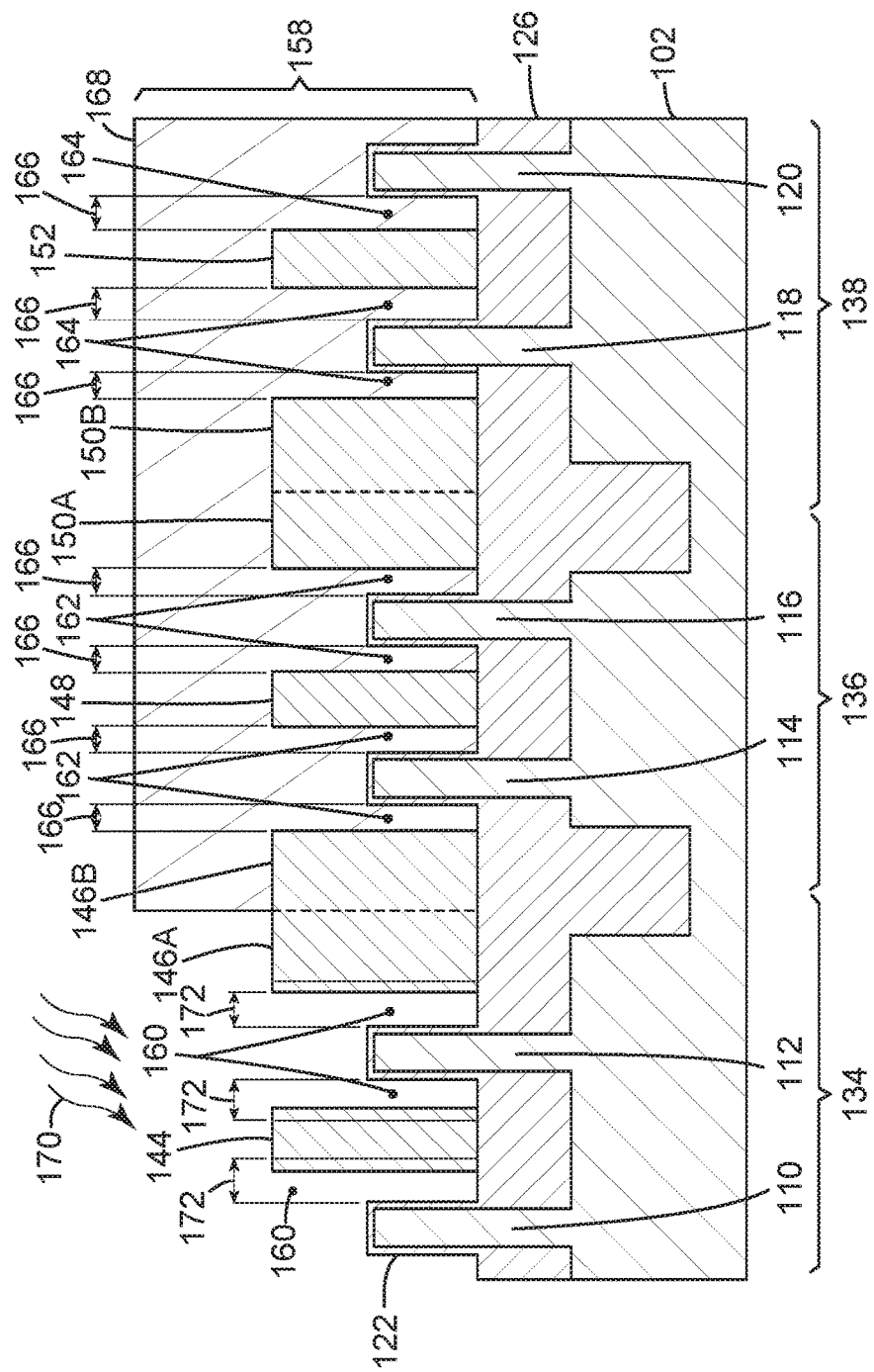
FIG. 9 is a cross-sectional view of FIG. 8 with a first block layer disposed thereon in accordance with the present invention.

Referring to FIG. 9, next a first blocking layer 168 is disposed over the second pillars 146B, 148, 150A and the third pillars 150B, 152, therefore leaving the first pillars 144, 146A exposed. The blocking mask 168 essentially exposes isolation region 134 and covers both electrically isolated regions 136 and 138, including any structures (or portions of structures such as pillar portions 146B) that overlay regions 136 and 138. The blocking layer 168 may be composed of an amorphous silicon or an amorphous carbine.

The first pillars 144, 146A are then exposed to a predetermined first energy level of UV energy to perform a UV cure of the first pillars. Ultraviolet energy typically has a wavelength in a range of 10 nm to 400 nm and may be applied through such means as a laser light. Since the pillars 144-152 are composed of a UV curable material, more specifically in this case a UV curable nitride such as SiN, the UV energy will cure and densify the first pillars 144, 146A.

In this way, the thickness of the first pillars 144, 146A can be adjusted to provide a second trench width 172 for the WF metal trenches 160. More specifically, in this exemplary embodiment, the first level of UV energy 170 reduces the thickness of the first pillars 144, 146A a predetermined amount to provide the second trench width 172. For example, the second trench width 172 may be within a range of 0 to 16 percent larger than the first trench width 166. Since the blocking layer 168 shields the second pillars 146B, 148, 150A and the third pillars 150B, 152 from the UV energy 170, the first 162 and second 164 trenches maintain their original first trench width 166.

Though this exemplary embodiment illustrates an adjustment of the thickness of first pillars 144, 146A by utilizing UV energy to reduce the pillar thickness, one skilled in the art would recognize that other techniques can be used to adjust pillar thickness. For example, the thickness of first pillars 144, 146A may be increased a predetermined amount by disposing a conformal coating over the pillars with an oxide layer or similar.

Figure 10:
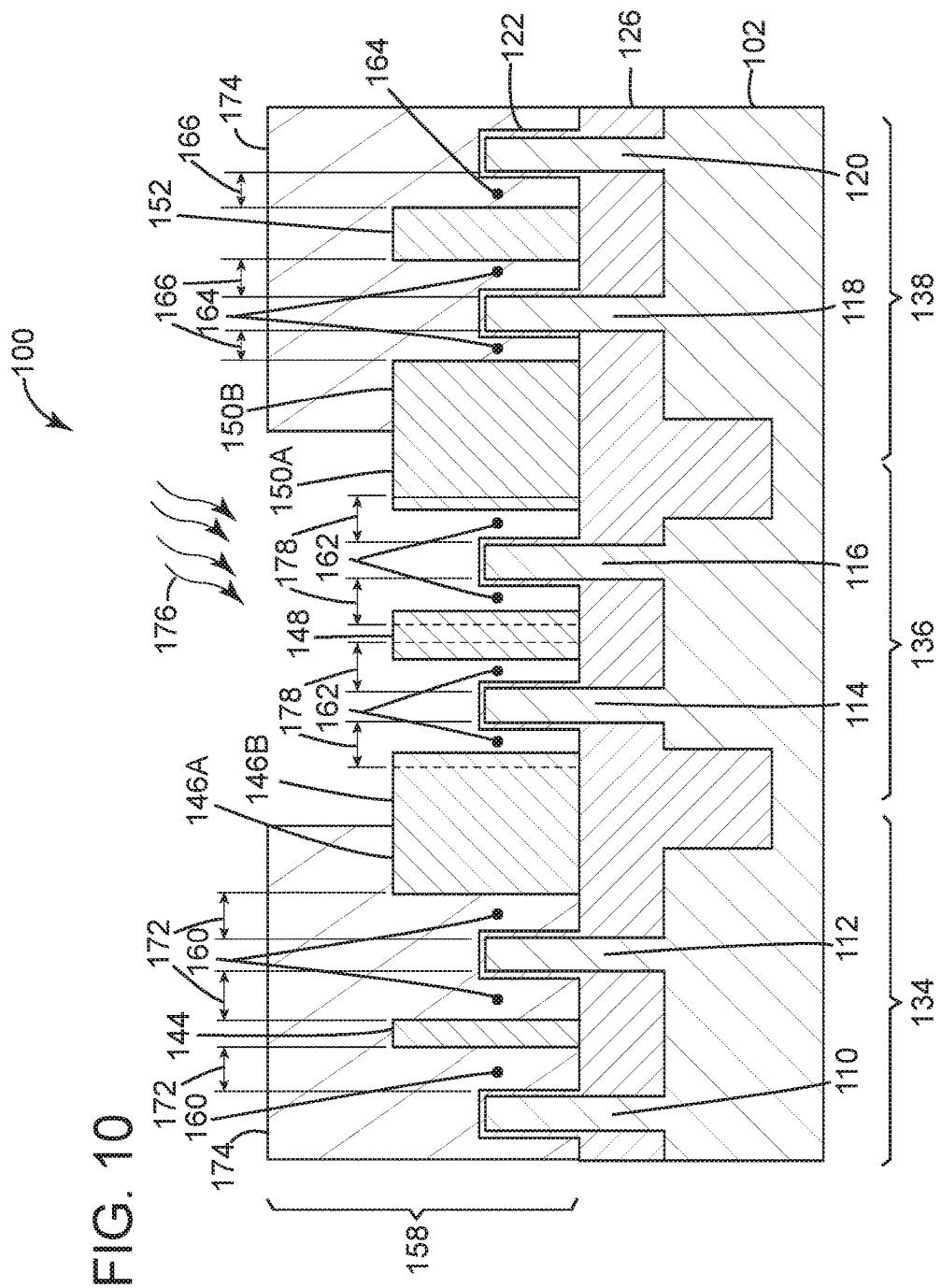
FIG. 10 is a cross-sectional view of FIG. 9 with the first block layer removed and a second block layer disposed thereon in accordance with the present invention.

Referring to FIG. 10, next a second blocking layer 174 is disposed over the first pillars 144, 146A and the third pillars 150B, 152, therefore leaving the second pillars 146B, 148, 150A exposed. The blocking mask 174 essentially exposes second isolation region 136 and covers both electrically isolated regions 134 and 138, including any structures (or portions of structures such as pillar portions 146A and 150B) that overlay regions 134 and 138. The second blocking layer 174 may be composed of the same amorphous silicon or an amorphous carbine as the first blocking layer 168.

The second pillars 146B, 148, 150A are then exposed to a predetermined second energy level of UV energy to perform a UV cure of the second pillars. In this embodiment, the second energy level 176 is different from the first energy level 170. More specifically, the second energy level 176 is less than the first energy level 170.

Since the second pillars 146B, 148 and 150A are composed of a UV curable nitride, the thickness of the second pillars can be adjusted to provide a third trench width 178 for the second WF metal trenches 162. More specifically, in this exemplary embodiment, the second level of UV energy 176 reduces the thickness of the second pillars 146B, 148, 150A a predetermined amount to provide the third trench width 178 for the second WF metal trenches 162. For example, the third trench width 172 may also be within a range of 0 to 16 percent larger than the first trench width 166. Since the blocking layer 174 shields the first pillars 144, 146A and the third pillars 150B, 152 from the UV energy 176, the first WF metal trenches 160 maintain their second trench width 172 and the third WF metal trenches 164 maintain their original first trench width 166.

Additionally, since the first UV energy level 170, in this embodiment, is greater than the second UV energy level 176, the corresponding reduction in thickness of the first pillars 144, 146A is greater than the corresponding reduction in thickness of the second pillars 146B, 148, 150A. In other words, the resulting second trench width 172 in the first electrically isolated region 134 is greater than the third trench width 178 in the second electrically isolated region 136. Moreover, the original first trench width 166 in the third electrically isolated region 138 is smaller than both the second 172 and third 178 trench widths.

Figure 11:
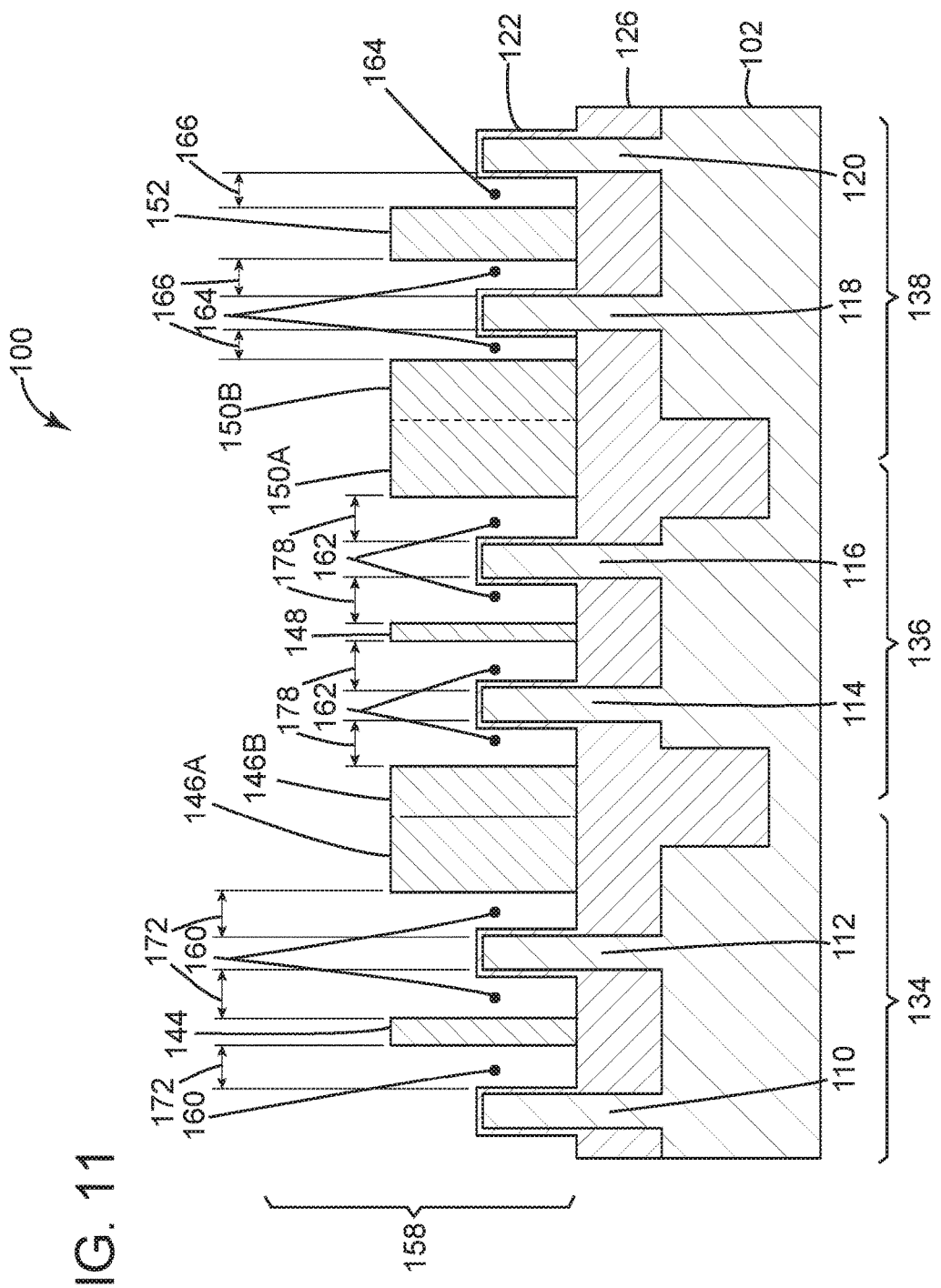
FIG. 11 is a cross-sectional view of FIG. 10 with the second block layer removed in accordance with the present invention.

Referring to FIG. 11, the second blocking layer 174 is next removed. At this stage of the process flow, the structure 100 now has three different WF metal trench widths 172, 178 and 166 for the three different electrically isolated regions 134, 136 and 138 respectively within the gates 158.

Figure 12:
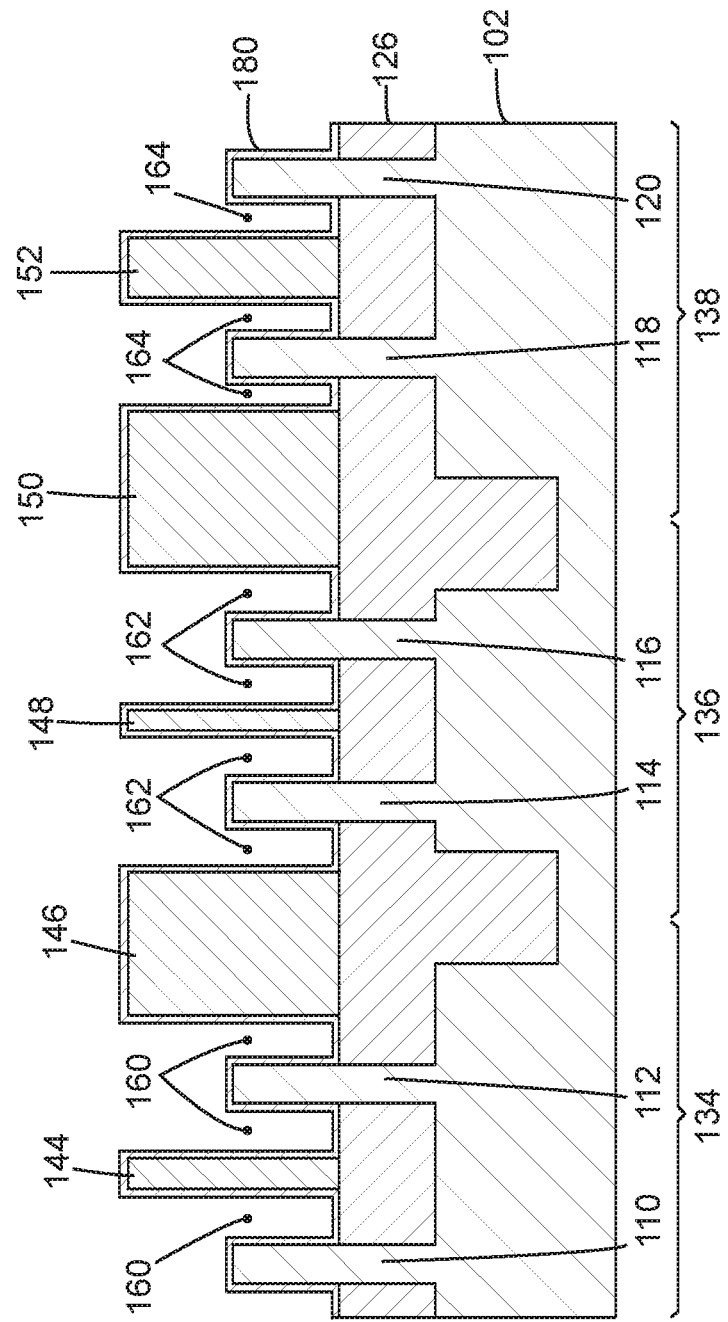
FIG. 12 is a cross-sectional view of FIG. 11 with a gate electrode layer disposed thereon in accordance with the present invention.

Referring to FIG. 12, next the thin oxide layer 122 is removed by such means as wet etching or RIE. The trenches 160, 162, 164 are now cleared for formation of gate stacks for FinFETs.

Gate stacks generally include three main groups of structures. Those three main structures are: the gate dielectric layers (typically a high-k dielectric material), the work-function (WF) metal structures (typically TiN, TaN, TiCAl, other metal-nitrides or similar materials) and the gate electrode metal (typically Al, W, Cu or similar metal). The gate dielectric layers are used to electrically insulate the WF metal structures and the gate electrodes from the substrate. The WF metal structures are generally metal-nitrides that provide the work-function needed for proper FinFET operation, but have a 10 to 100 times larger resistivity than the gate electrodes. The gate electrodes are metals with a very low resistivity.

At the stage of process flow illustrated in FIG. 12, a gate dielectric 180 (typically a high k dielectric such as hafnium oxide (HfO2) with a silicon dioxide (SiO2) interfacial layer or similar) is disposed over the entire structure 100. The gate electrode can be disposed over structure 100 by such means as atomic layer deposition and has a substantially uniform dielectric layer thickness.

Figure 13:
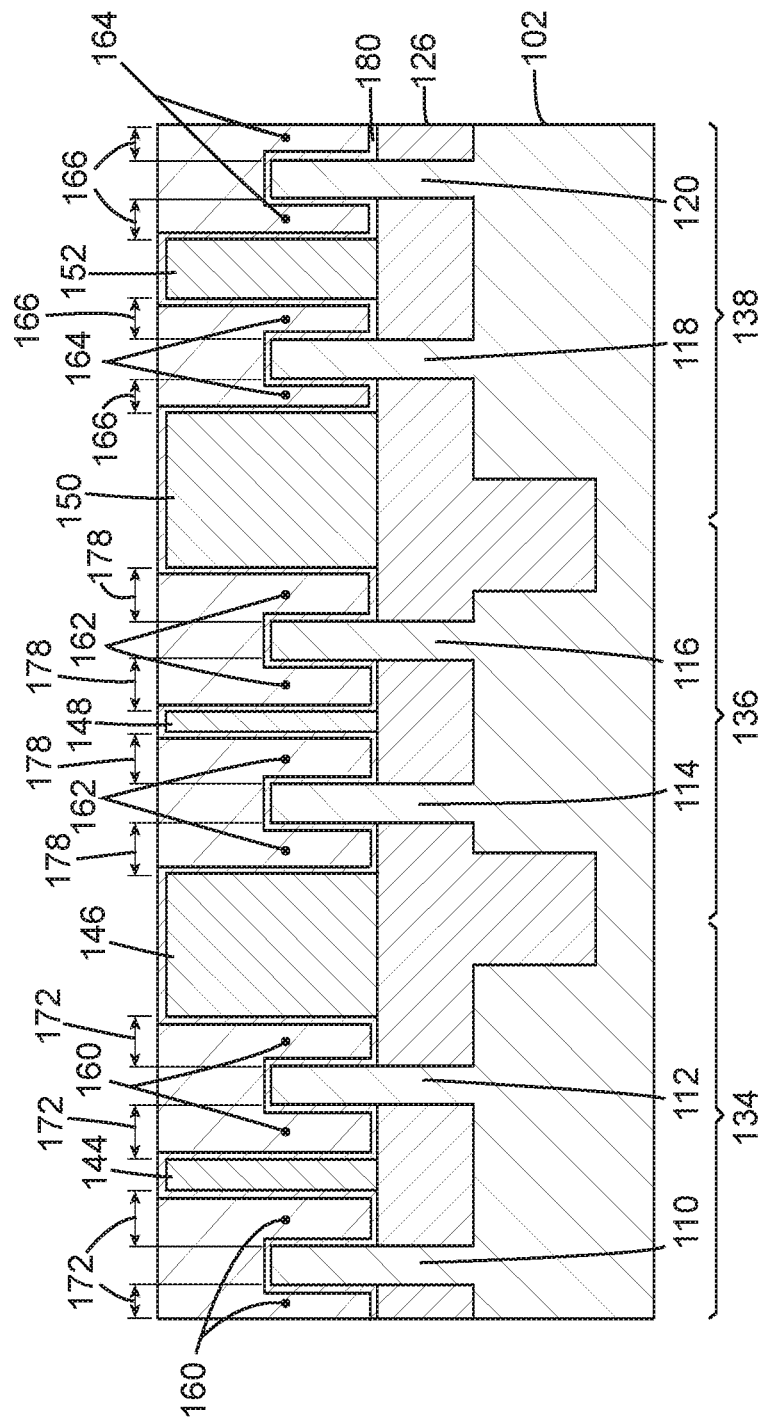
FIG. 13 is a cross-sectional view of FIG. 12 with work-function metal structures disposed between the pillars and over the fins in accordance with the present invention.

Referring to FIG. 13, first WF metal structures 182, second WF metal structures 184 and third WF metal structures 186 are next disposed within the first, second and third WF metal trenches 160, 162 and 164 respectively. The WF metal structures 182, 184, 186 can be disposed within the trenches 160, 162, 164 and over the fins 110-120 by first disposing a WF metal layer (not shown) over the entire structure 100 by such means as CVD. The WF metal layer is then planarized down to expose the tops of the pillars 144-152 and to complete the formation of the WF metal structures 182, 184, 186.

It is important to note that within the WF metal trenches 160, 162, 164, the WF metal structures 182, 184, 186 have a thickness substantially equal to the trench width minus the gate dielectric thickness. More specifically, within the first trench 160, the thickness of first WF metal structure 182 is substantially the second trench width 172 minus the gate dielectric thickness. Within the second trench 162, the thickness of the second WF metal structure 184 is substantially the third trench width 178 minus the same gate dielectric thickness. Also, within the third trench 164, the thickness of the third WF metal structure 186 is substantially the first trench width 166 minus the same gate dielectric thickness.

Since the three trench widths 166, 172, 178 are different, the thickness of the three WF metal structures 182, 184, 186 are also different. Since the threshold voltage (Vt) within a region 134, 136, 138 is dependent on the WF metal structure thickness (especially with small WF metal thicknesses such as in the range of 3-10 nm), then each of the three electrically isolated regions 134, 136 and 138 will advantageously have a different Vt.

Figure 14:
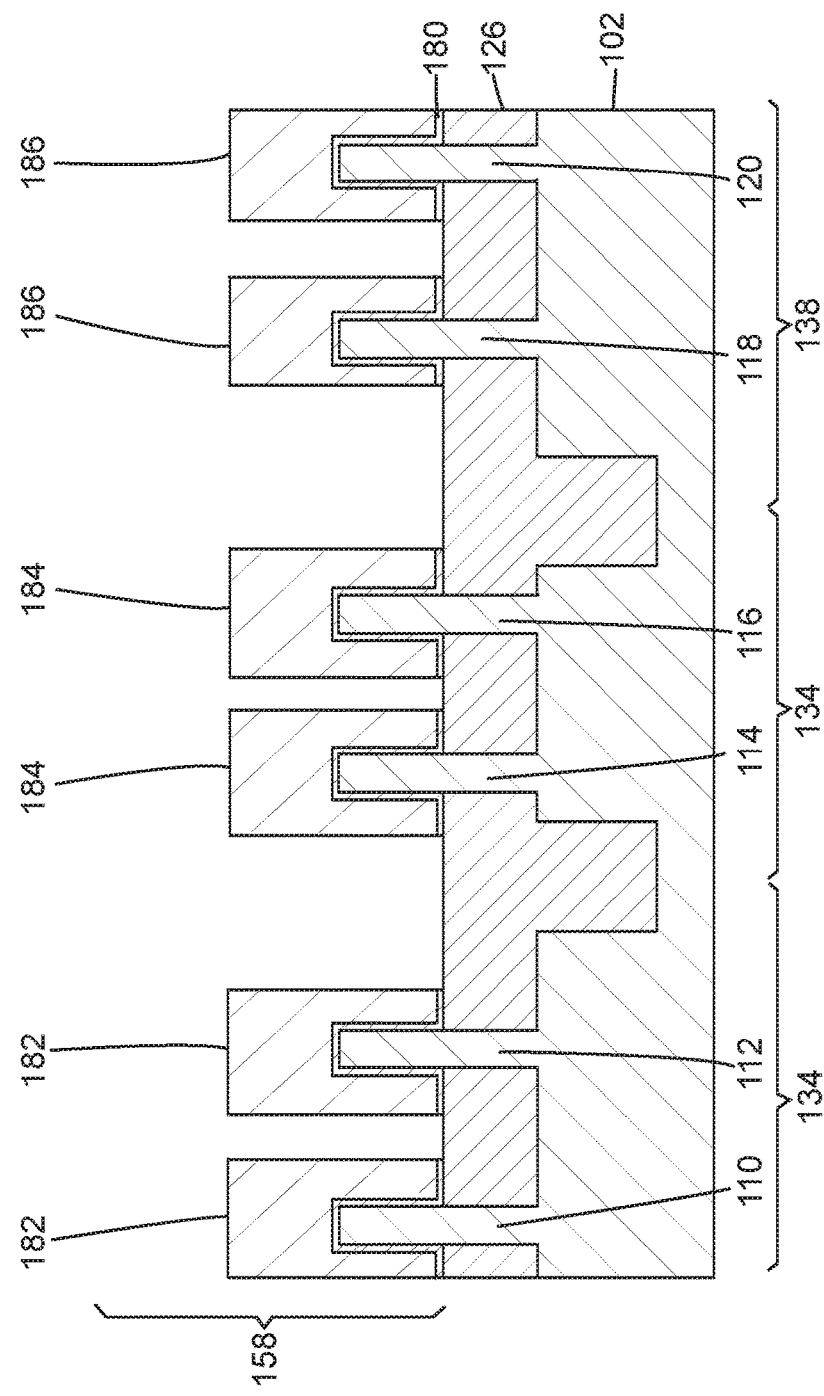
FIG. 14 is a cross-sectional view of FIG. 13 with the pillars removed in accordance with the present invention.

Referring to FIG. 14, the pillars 144-152 are next removed. The pillars 144-152 may be removed by such means as RIE or wet etching. Additionally, that portion of the gate dielectric material 180 that abuts the pillars 144-152 is also removed via the same removal processes.

Figure 15:
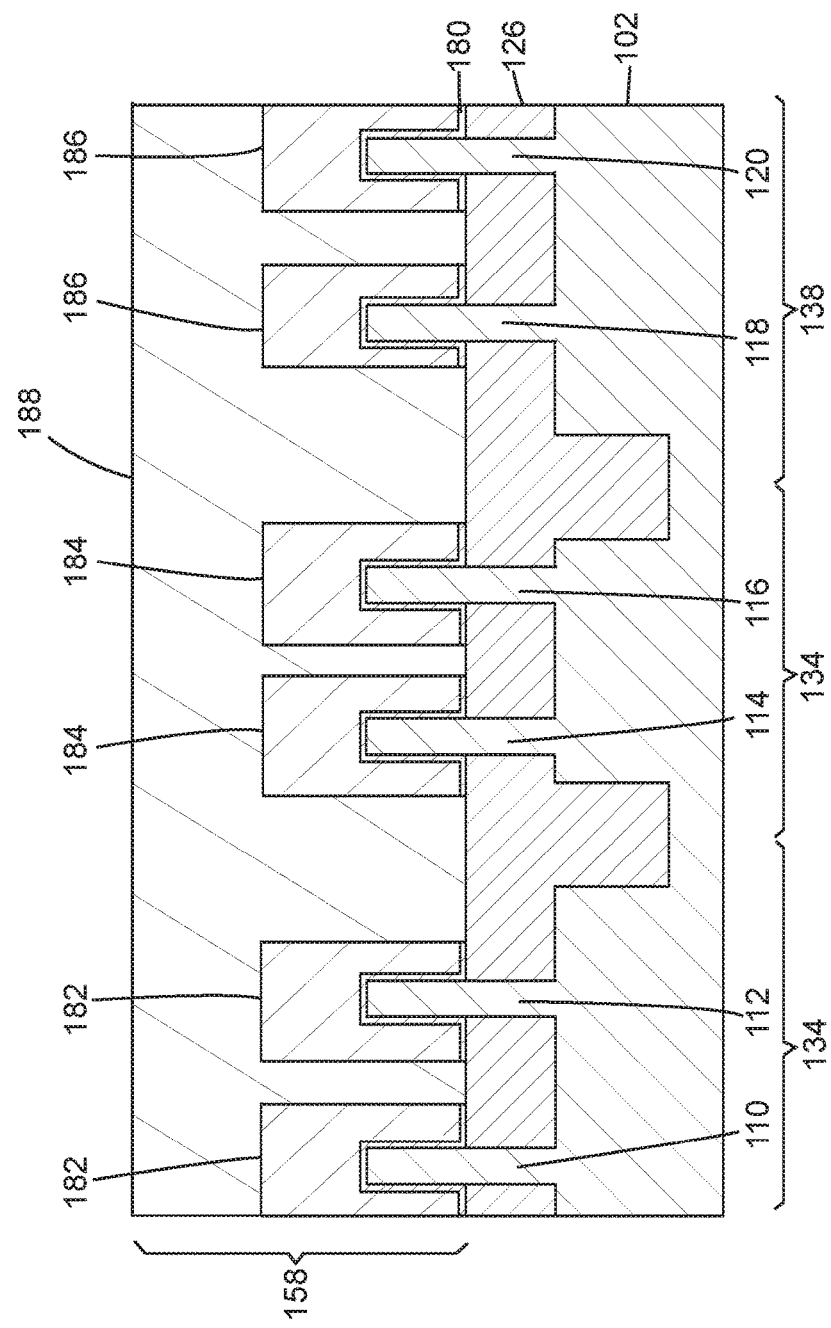
FIG. 15 is a cross-sectional view of FIG. 14 with a gate electrode metal layer disposed thereon in accordance with the present invention.

Referring to FIG. 15, a gate electrode metal layer 188 is next disposed within the gate 158 and over the WF metal structures by well-known methods to complete the gate stack. The electrode metal layer 188 may be composed of Al, Cu, W or similar.

Advantageously, the three regions 134, 136, 138 of structure 100 now have different threshold voltages by virtue of the various thicknesses associated with the three different WF metal structures 182, 184 186. Also advantageously, the various thicknesses of the WF metal structures 182, 184, 186 were attained with a single deposition of WF metal. Therefore, multiple depositions and removals of WF metal onto and off of the gate dielectric 180 were avoided, thus reducing the possibility of damaging the gate dielectric 180.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
    providing a semiconductor structure having a substrate, the substrate including a longitudinally extending array of fins formed thereon;
    forming spacers on sidewalls of fins of the array;
    forming pillars between and adjacent the spacers;
    forming a gate having dummy gate material over the structure, the gate extending laterally across the spacers and fins of the array;
    removing the dummy gate material and spacers from the gate to form work-function (WF) metal trenches defined by the pillars and fins within the gate, the WF metal trenches having a first trench width;
    adjusting a thickness of the pillars to provide a second trench width, different from the first trench width, for the WF metal trenches; and
    disposing a WF metal structure within the WF metal trenches.

2. The method of claim 1 comprising:
    forming first and second arrays of fins on the substrate;
    removing the dummy gate material and spacers from the gate to form first WF metal trenches defined by first pillars and fins of the first array within the gate;
    removing the dummy gate material and spacers from the gate to form second WF metal trenches defined by second pillars and fins of the second array within the gate, the first and second WF metal trenches having the first trench width;
    adjusting a thickness of the first pillars to provide the second trench width for the first WF metal trenches;
    adjusting a thickness of the second pillars to provide a third trench width, different from the first and second trench widths, for the second WF metal trenches;
    disposing a first WF metal structure within the first WF metal trenches; and
    disposing a second WF metal structure within the second WF metal trenches.

3. The method of claim 1 wherein the pillars are composed of an ultraviolet (UV) curable nitride material, the method comprising:
    exposing the pillars to a first energy level of UV energy to reduce the thickness of the pillars a predetermined amount and provide the second trench width.

4. The method of claim 2 wherein the first and second pillars are composed of a UV curable nitride material, the method comprising:
    exposing the first pillars to a first energy level of UV energy to reduce the thickness of the first pillars a predetermined amount and provide the second trench width; and
    exposing the second pillars to a second energy level of UV energy, the second energy level being different from the first energy level, to reduce the thickness of the second pillars a predetermined amount and provide the third trench width.

5. The method of claim 4 comprising:
    disposing a first blocking layer over the second pillars prior to exposing the first pillars to the first energy level of UV energy; and
    disposing a second blocking layer over the first pillars prior to exposing the second pillars to the second energy level of UV energy.

6. The method of claim 1 comprising:
    forming spacers having a substantially uniform spacer thickness on the sidewalls of the fins of the array; and
    wherein the first trench width of the WF metal trenches is substantially equal to the spacer thickness.

7. The method of claim 1 wherein the first trench width is within a range of 3 to 10 nanometers.

8. The method of claim 1 wherein the second trench width is within a range of 0 to 16 percent larger than the first trench width.

9. The method of claim 1 comprising:
    forming amorphous silicon spacers on the sidewalls of the fins of the array;
    forming UV curable nitride pillars between and adjacent the spacers;
    disposing a poly-silicon layer over the structure without removing the spacers; and
    patterning the poly-silicon layer to form the gate.

10. A method comprising:
    providing a structure having a substrate, the substrate including longitudinally extending first and second arrays of fins formed thereon;
    forming spacers on sidewalls of fins of the first and second arrays;
    forming first pillars between and adjacent the spacers of the first array;
    forming second pillars between and adjacent the spacers of the second array;
    forming a gate having dummy gate material over the structure, the gate extending laterally across the spacers and fins of the first and second arrays;
    removing the dummy gate material and spacers from the gate to form first WF metal trenches defined by the first pillars and fins of the first array within the gate;
    removing the dummy gate material and spacers from the gate to form second WF metal trenches defined by the second pillars and fins of the second array within the gate.

11. The method of claim 10 comprising:
    adjusting a thickness of the first pillars to provide a second trench width, different from the first trench width, for the first WF metal trenches.

12. The method of claim 11 comprising:
    adjusting a thickness of the second pillars to provide a third trench width, different from the first and second trench widths, for the second WF metal trenches.

13. The method of claim 12 comprising:
disposing a first WF metal structure within the first WF metal trenches; and
forming first FinFETs utilizing the first WF metal structure, wherein the first FinFETs have a first threshold voltage (Vt).

14. The method of claim 13 comprising:
disposing a second WF metal structure within the second WF metal trenches; and
forming second FinFETs utilizing the second WF metal structure, wherein the second FinFETs have a second Vt, the first Vt being different from the second Vt.

15. The method of claim 12 wherein the second and third trench widths are within a range of 0 to 16 percent larger than the first trench width.

16. The method of claim 12 wherein the first and second pillars are composed of a UV curable nitride material, the method comprising:
exposing the first pillars to a first energy level of UV energy to reduce the thickness of the first pillars a predetermined amount and provide the second trench width; and
exposing the second pillars to a second energy level of UV energy, the second energy level being different from the first energy level, to reduce the thickness of the second pillars a predetermined amount and provide the third trench width.

17. The method of claim 10 wherein the first trench width is within a range of 3 to 10 nanometers.

* * * * *